(12) United States Patent
Edmond

(10) Patent No.: US 8,513,686 B2
(45) Date of Patent: Aug. 20, 2013

(54) HIGH OUTPUT SMALL AREA GROUP III NITRIDE LEDS

(75) Inventor: John Adam Edmond, Cary, NC (US)

(73) Assignee: Cree, Inc., Durham, NC (US)

( * ) Notice: Subject to any disclaimer, the term of this patent is extended or adjusted under 35 U.S.C. 154(b) by 134 days.

(21) Appl. No.: 11/037,965

(22) Filed: Jan. 18, 2005

(65) Prior Publication Data

US 2006/0060879 A1    Mar. 23, 2006

Related U.S. Application Data

(63) Continuation-in-part of application No. 10/951,042, filed on Sep. 22, 2004, now Pat. No. 7,259,402.

(51) Int. Cl.
*H01L 33/26* (2010.01)

(52) U.S. Cl.
USPC ............... 257/98; 257/E33.03; 257/E33.068

(58) Field of Classification Search
USPC ........... 257/79, 94, 103, 98, E33.03, E33.068
See application file for complete search history.

(56) References Cited

U.S. PATENT DOCUMENTS

| | | | |
|---|---|---|---|
| 2,001,622 A | 5/1935 | McCaa |
| 4,703,219 A | 10/1987 | Mesquida |
| 4,902,356 A | 2/1990 | Noguchi et al. |
| 4,912,532 A | 3/1990 | Cook et al. |
| 5,103,271 A | 4/1992 | Izumiya et al. |
| 5,376,580 A | 12/1994 | Kish et al. |
| 5,416,342 A | 5/1995 | Edmond et al. |
| 5,502,316 A | 3/1996 | Kish et al. |
| 5,739,554 A | 4/1998 | Edmond et al. |
| 5,838,706 A | 11/1998 | Edmond et al. |
| 5,912,477 A | 6/1999 | Negley |
| 5,985,687 A | 11/1999 | Bowers et al. |
| 6,071,795 A | 6/2000 | Cheung et al. |
| 6,100,104 A | 8/2000 | Haerle et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,258,699 B1 | 7/2001 | Chang et al. |
| 6,303,405 B1 | 10/2001 | Yoshida et al. |
| 6,335,263 B1 | 1/2002 | Cheung et al. |
| 6,365,429 B1 | 4/2002 | Kneissl et al. |

(Continued)

FOREIGN PATENT DOCUMENTS

| | | |
|---|---|---|
| EP | 1 263 058 A | 12/2002 |
| JP | 61059886 | 3/1986 |
| JP | 11238913 | 8/1999 |

OTHER PUBLICATIONS

Harle et al., "Advanced Technologies for High Efficiency GaInN LEDs for solid state lighting," Third International Conference on Solid State Lighting, Proceedings of SPIE, vol. 5187, Jan. 2004.*

(Continued)

*Primary Examiner* — Colleen Matthews
(74) *Attorney, Agent, or Firm* — Steven B. Phillips; Moore & Van Allen PLLC

(57) ABSTRACT

A light emitting diode is disclosed with advantageous output on a per unit area basis. The diode includes an area of less than 100,000 square microns, operates at a forward voltage of less than 4.0 volts, produces a radiant flux of at least 24 milliwatts at 20 milliamps drive current, and emits at a dominant wavelength between about 395 and 540 nanometers.

32 Claims, 4 Drawing Sheets

(56) References Cited

U.S. PATENT DOCUMENTS

| | | | |
|---|---|---|---|
| 6,373,077 | B1 | 4/2002 | Edmond et al. |
| 6,403,985 | B1 | 6/2002 | Fan et al. |
| 6,410,940 | B1 | 6/2002 | Jiang et al. |
| 6,410,942 | B1 | 6/2002 | Thibeault et al. |
| 6,420,199 | B1 | 7/2002 | Coman et al. |
| 6,420,242 | B1 | 7/2002 | Cheung et al. |
| 6,448,102 | B1 | 9/2002 | Kneissl et al. |
| 6,459,100 | B1 | 10/2002 | Doverspike et al. |
| 6,465,809 | B1 | 10/2002 | Furukawa et al. |
| 6,468,824 | B2 | 10/2002 | Chen et al. |
| 6,559,075 | B1 | 5/2003 | Kelly et al. |
| 6,562,648 | B1 | 5/2003 | Wong et al. |
| 6,607,931 | B2 | 8/2003 | Streubel |
| 6,610,551 | B1 | 8/2003 | Doverspike et al. |
| 6,635,503 | B2 | 10/2003 | Andrews et al. |
| 6,649,437 | B1 | 11/2003 | Yang et al. |
| 6,657,236 | B1 | 12/2003 | Thibeault et al. |
| 6,664,560 | B2 | 12/2003 | Emerson et al. |
| 6,677,173 | B2 | 1/2004 | Ota |
| 6,716,654 | B2 | 4/2004 | Hsu et al. |
| 6,734,033 | B2 | 5/2004 | Emerson et al. |
| 6,740,604 | B2 | 5/2004 | Kelly et al. |
| 6,740,906 | B2 | 5/2004 | Slater, Jr. et al. |
| 6,747,298 | B2 | 6/2004 | Slater, Jr. et al. |
| 6,757,314 | B2 | 6/2004 | Kneissl et al. |
| 6,786,390 | B2 | 9/2004 | Yang et al. |
| 6,791,119 | B2 | 9/2004 | Slater, Jr. et al. |
| 6,800,500 | B2 | 10/2004 | Coman et al. |
| 6,800,876 | B2 | 10/2004 | Edmond et al. |
| 6,806,112 | B1 | 10/2004 | Horng et al. |
| 6,809,341 | B2 | 10/2004 | Hsu et al. |
| 6,815,312 | B2 | 11/2004 | Furukawa et al. |
| 6,821,804 | B2 | 11/2004 | Thibeault et al. |
| 6,825,501 | B2 | 11/2004 | Edmond et al. |
| 6,846,686 | B2 | 1/2005 | Saeki et al. |
| 6,849,878 | B2 | 2/2005 | Bader et al. |
| 2002/0022290 | A1 | 2/2002 | Kong et al. |
| 2002/0068373 | A1 | 6/2002 | Lo et al. |
| 2002/0121642 | A1 | 9/2002 | Doverspike et al. |
| 2002/0123164 | A1* | 9/2002 | Slater et al. ......... 438/39 |
| 2002/0197764 | A1 | 12/2002 | Uemura et al. |
| 2003/0015721 | A1 | 1/2003 | Slater et al. |
| 2003/0045015 | A1 | 3/2003 | Slater, Jr. et al. |
| 2003/0132701 | A1 | 7/2003 | Sato et al. |
| 2003/0173602 | A1 | 9/2003 | Hsu et al. |
| 2003/0197170 | A1 | 10/2003 | Bader et al. |
| 2004/0004226 | A1 | 1/2004 | Eisert et al. |
| 2004/0012027 | A1 | 1/2004 | Keller et al. |
| 2004/0033638 | A1 | 2/2004 | Bader et al. |
| 2004/0072382 | A1 | 4/2004 | Kelly et al. |
| 2004/0124429 | A1 | 7/2004 | Stokes et al. |
| 2004/0135158 | A1 | 7/2004 | Hon |
| 2005/0006669 | A1 | 1/2005 | Mishra et al. |
| 2006/0249736 | A1* | 11/2006 | Lee et al. ......... 257/79 |

OTHER PUBLICATIONS

Harle et al., Advanced Technologies for High Efficiency GaInN LEDs for Solid State Lighting, Third Intl. Conference on Solid State Lighting, Proc. of SPIE, vol. 5187, 2004.

Koike et al., Development of High Efficency GaN-based Multiquantum-Well Light Emitting Diodes and their Applications, IEEE, vol. 8 No. 2, Mar.-Apr. 2002.

Kuo et al., Nitride-based Near-Ultraviolet LEDs with an ITO Transparent Contact, Materials Science and Engineering, vol. B106, pp. 69-72, 2004.

Gardner et al., High-Flux and High Efficiency Nitride-Based Light Emitting Diodes, IEEE, pp. 641-642, 2002.

Craford, M. George, Visible LEDs: The Trend Toward High Power Emitters and Remaining Challenges for Solid State Lighting, Solid State Lighting II, Proc. of SPIE, vol. 4776, 2002.

Niki et al., White LEDs for Solid State Lighting, Third International Conference on Solid State Lighting, Proc. of SPIE, vol. 5187, 2004.

Tadamoto et al., High Output Power Near-Ultraviolet and Violet Light-Emitting Diodes Fabricated on Patterned Sapphire Substrates Using Metalorganic Vapor Phase Epitaxy, Third Intl. Conference on Solid State Lighting, Proc. of SPIE, vol. 5187, 2004.

Mukai et al., Recent Progress of Nitride-Based Light Emitting Devices, Phys. Stat. Sol. vol. 200, No. 1, pp. 52-57, 2003.

Mukai et al., GaN-based Light-Emitting Diodes Suitable for White Light, Light Emitting Diodes: Research, Manufacturing, and Applications VII, Proc. of SPIE, vol. 4996, 2003.

Morita et al., Over 200 mW on 365 nm Ultraviolet Light Emitting Diode of GaN-free Structure, Phys. Stat. Sol., vol. 200, No. 1, pp. 114-117, 2003.

United Epitaxy Company, Ltd., Specifications Confirmation Letter, 4713DC AlInGaN Blue LED Chip, 2003.

Labsphere, The Radiometry of Light Emitting Diodes—Technical Guide.

Epitech Technology Corporation, Traffic Green LED Chip, Dec. 2003.

Seoul Semiconductor Co. Ltd., AlInGaN LED DICE, 2003.

Epitech Technology Corporation, Near Blue LED Chip, Dec. 2003.

Unity Opto Technology Co., Ltd., AlGaAs/GaAs High Power T-1 3/4 Package Infrared Emitting Diode, Nov. 17, 2000.

Nichia Corporation, White LED Analysis, Mar. 17, 2004.

Instrument Systems, LED Station, MAS 40 Turn-key System for LED Testing.

Bulman, G.E., et al ; "Nitride Lasers on SiC Substrates," Lasers and Electro-Optics Annual Meeting, ISBN 0-7803-4947-4, IEEE, Dec. 1, 1998, vol. 2, pp. 348-349.

Windisch R, et al; "40% Efficient Thin-Film Surface-Textured Light-Emitting Dios by Optimization of Natural Lithography," IEEE Transactions on Electron Devices, ISSN: 0018-9383, vol. 47 No. 7, Jul. 2000 pp. 1492-1498.

Nakamura S, et al; "Superbright Green Ingan Single-Quantum-Well-Structure Light-Emitting Diodes," Japanese Journal of Applied Physics, ISSN: 0021-4922, vol. 34., No. 10B, Part 2, Oct. 15, 1995, pp. L1332-L1335.

* cited by examiner

HIGH OUTPUT SMALL AREA GROUP III NITRIDE LEDS

RELATED APPLICATIONS

This application is a continuation-in-part of Ser. No. 10/951,042 filed Sep. 22, 2004 now U.S. Pat. No. 7,259,402 for "High Efficiency Group III Nitride Silicon Carbide Light Emitting Diode," the contents of which are incorporated entirely herein by reference.

BACKGROUND

The present invention relates to light emitting diodes (LEDs) and in particular relates to LEDs formed with active portions of Group III nitrides on silicon carbide substrates.

Lighting Technologies

Lighting devices for many applications fall into several broad categories. Incandescent lighting is produced by heating a metal filament, usually by passing electric current through a metal filament. The heated filament emits light. Household and other indoor lighting is a common application of incandescent lighting. "Halogen" lighting works on the same general principle, but more efficiently. Fluorescent light is generated by exciting a vapor (typically mercury-containing) with an applied potential difference. Photons emitted by the excited vapor then strike phosphors that emit the visible light. Fluorescent light is also common in household, office and a variety of other applications.

Light Emitting Diodes

A light emitting diode (LED) is a p-n junction semiconductor diode that emits photons when forward biased. Thus, light emitting diodes produce light based upon the movement of electrons in a semiconductor material. Therefore, LEDs do not require (although they can be used in conjunction with) vapors or phosphors. They share the desirable characteristics of most semiconductor-based devices, including high efficiency (their emissions include little or no heat), high reliability and long life. For example, typical LEDs have a mean time between failures of between about 100,000 and 1,000,000 hours meaning that a conservative half lifetime for an LED is on the order of 50,000 hours.

In particular, an LED's emitted light has a frequency (which in turn relates directly to wavelength and color in accordance with well-understood principles of physics) based upon the energy difference between permitted energy levels in the material, a characteristic referred to as the bandgap. The bandgap is a fundamentally property of the semiconductor material and its doping. Thus, LEDs formed in silicon (Si, bandgap of 1.12 electron volts (eV)) will have energy transitions in the infrared (but not the visible) portions of the spectrum. Silicon-based diode are thus used for items such as low-cost sensors in which visibility to the human eye is either unimportant or specifically undesired. LEDs formed in gallium arsenide (bandgap 1.42 eV), or most commonly in silicon-doped aluminum gallium arsenide (AlGaAs) will emit in the visible portion of the spectrum, but at lower frequencies that produce infrared radiation and red and yellow light.

In turn, because green, blue, and ultraviolet (UV) photons represent higher frequency colors (E=hv) within (and beyond) the visible spectrum, they can only be produced by LEDs with bandgaps of at least about 2.2 eV. Such materials include diamond (5.47 eV), silicon carbide (2.99 eV) and Group III nitrides such as GaN (3.4 eV). In addition to producing green, blue or ultraviolet light per se, wide bandgap LEDs can be combined with red and green LEDs to produce white light, or with phosphors that produce white light when excited by blue or UV light, or both.

For several reasons, the Group III nitride compositions (i.e., Group III of the periodic table), particularly GaN, AlGaN, InGaN and AlInGaN are particularly useful for blue-emitting LEDs. As one advantage, they are "direct" emitters, meaning that when an electron transition occurs across the bandgap, much of the energy is emitted as light. By comparison, "indirect" emitters (such as silicon carbide) emit their energy partially as light (a photon) and predominantly as vibrational energy (a phonon). Thus Group III nitrides offer efficiency advantages over indirect transition materials.

As another advantage, the bandgap of ternary and quaternary Group III materials (e.g., AlGaN, InGaN, AlInGaN) depends upon the atomic fraction of the included Group III elements. Thus the wavelength (color) of the emission can be tailored (within limits) by controlling the atomic fraction of each Group III element in a ternary or quaternary nitride.

Wide bandgap semiconductors have been, however, historically more difficult to produce and work with than gallium-arsenide or gallium phosphide (GaP). As a result, blue and UV-emitting LEDs have lagged behind GaP-based LED's in their commercial appearance. For example, silicon carbide is physically very hard, has no melt phase, and requires high temperatures (on the order of about 1500-2000° C.) for epitaxial or sublimation growth. The Group III nitrides have relatively large nitrogen vapor pressures at their melting temperatures and thus are likewise difficult or impossible to grow from a melt. Additionally, difficulties in obtaining p-type gallium nitride (and other Group III nitrides) remained a barrier to diode production for a number of years. Accordingly, the commercial availability of blue and white-emitting LEDs is more recent than the corresponding availability of GaP-based and GaAs-based LEDs.

Nevertheless, based on more-recent developments, blue LED's and derivative white-emitting solid state lamps based upon Group III nitrides have become increasingly common in solid state lighting applications.

Quantity of Light Output

For comparison and other relevant purposes, lighting is typically quantified as to its output. One typical unit of measure is the lumen, defined as a unit of luminous flux equal to the light emitted in a unit solid angle by a uniform point source of one candela (cd) intensity. In turn, the candela is the base unit of luminous intensity in the International System of Units that is equal to the luminous intensity in a given direction of a source which emits monochromatic radiation of frequency $540\times10^{12}$ hertz and has a radiant intensity in that direction of 1/683 watt per unit solid angle.

Using lumens as the unit of measurement, an intensity of 1200-1800 lumens is typical of incandescent bulbs and 1000-6000 lumens (depending upon circumstances) is typical in natural daylight. Light emitting diodes, however, are much less intense, for example on the order of about 10-100 lumens. One reason is their small size. Thus, applications for single (or small groups of) LEDs have historically gravitated towards indication (e.g. the register of a hand-held calculator) rather than illumination (a reading lamp). Although the availability of blue LEDs and corresponding white-emitting devices have moved such LEDs into wider commercial availability, for illumination purposes, several (or more) LEDs are typically grouped together to provide the desired output.

Because of their typical size and structure, the output of LEDs is often measured in units other than lumens. Additionally, an LED's output also depends upon the applied current, which in turn depends upon the potential difference applied across the diode. Thus, the output of an LED is often referred to as its radiant flux ($R_f$) and is expressed in milliwatts (mW) at a standard 20 milliamp (mA) drive current.

In particular, blue LEDs and their related derivative devices are becoming more frequently included in consumer electronic devices, particularly small displays. Common examples include items such as computer screens, personal digital assistants ("PDAs") and cellular phones. In turn, these small devices drive demand for LEDs with reduced size ("footprint"). Such LEDs, however, must still operate at low forward voltages (Vf) and high light output. To date, however, reducing the size of the Group III nitride devices has tended to increase their forward voltage and reduce their radiant flux.

Accordingly, a need exists for continual improvement in the output of small-size LEDs formed in wide bandgap materials.

SUMMARY

In brief summary the invention is a light emitting diode having small size, low forward voltage and high light output.

In another aspect, the invention is a light emitting diode with advantageous output on a per unit area basis. The diode includes an area of less than 100,000 square microns, a forward voltage of less than 4.0 volts, a radiant flux of at least 24 milliwatts at 20 milliamps drive current, and a dominant wavelength between about 395 and 540 nanometers.

In another aspect, the invention is a light emitting diode that demonstrates a radiant flux of at least 270 milliwatts per square millimeter, at a dominant wavelength of between about 395 and 540 nm, at a forward voltage of less than 4.0 volts and at 20 milliamps drive current.

In another aspect, the invention is a light emitting diode with a die with an area of less than 100,000 $\mu^2$, a 5 mm package encapsulating the die, a forward voltage of less than 4.0 volts, an external quantum efficiency of greater than forty five percent (45%) at wavelengths of between about 420 and 465 nm and a drive current of 20 milliamps.

In another aspect, the invention is a light emitting diode that includes a 5 mm (TE 1¾) polymeric package, a die in the package with an area of less than 100,000 square microns, a forward voltage of less than 4.0 volts, a radiant flux of at least 24 milliwatts at 20 milliamps drive current, and a dominant wavelength of between about 395 and 540 nm.

In another aspect, the invention is a light emitting diode that includes a conductive silicon carbide substrate; respective p-type and n-type Group III nitride layers on the silicon carbide substrate; ohmic contacts in a vertical orientation with respect to the silicon carbide substrate and the Group III nitride layers; a dominant wavelength between 455 and 465 nm; a polymer package encapsulating the substrate, the Group III nitride layers and portions of the ohmic contacts; and a radiant flux from the package of at least 270 milliwatts per square millimeter of the emitting surface at a drive current of 20 milliamps.

The foregoing and other objects and advantages of the invention and the manner in which the same are accomplished will become clearer based on the followed detailed description taken in conjunction with the accompanying drawings.

DETAILED DESCRIPTION

The present invention is a light emitting diode having small size, a low forward voltage, and a high light output resulting in high-efficiency and high output on a per unit area basis.

As set forth in the Background, a number of structural features of the invention are set forth in commonly assigned and copending application Ser. No. 10/951,042.

Figure 1:
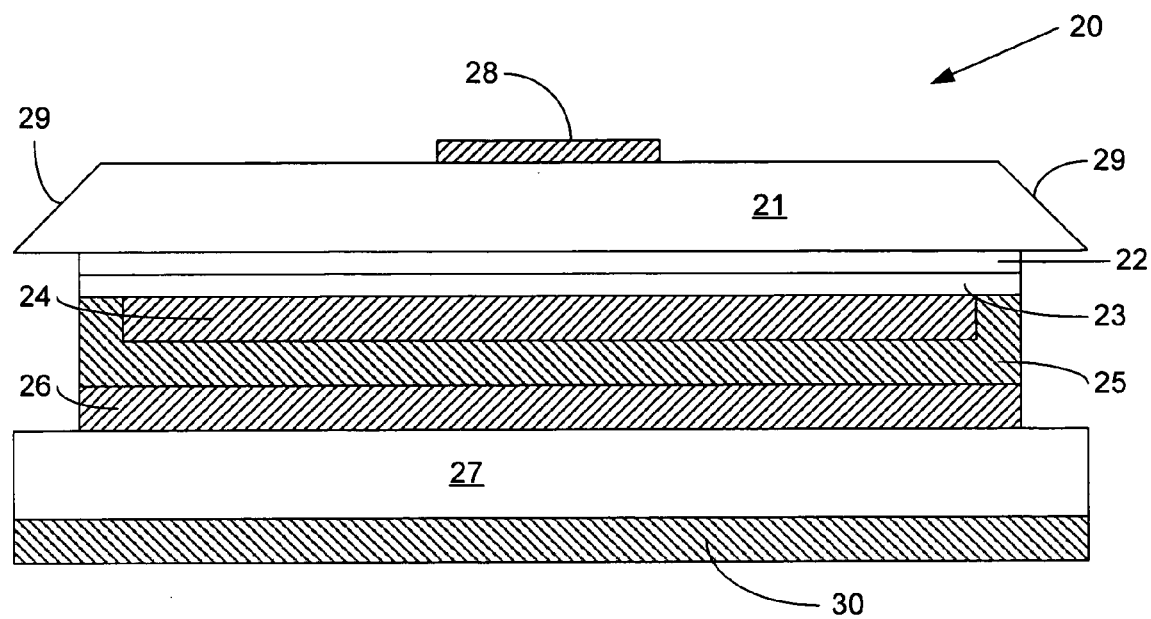
FIG. 1 is a cross-sectional view of a diode in accordance with the present invention.

As further description, FIG. 1 is a cross sectional view of a light emitting diode broadly designated at 20 having the performance characteristics of the present invention. The diode 20 includes a transparent silicon carbide substrate 21 which is preferably a single crystal and has a polytype selected from the 3C, 4H, 6H, and 15R polytypes of silicon carbide with 4H often being preferred in the context of the present invention. Because FIG. 1 illustrates the diode 20 in the "flip chip" orientation (i.e., mounted for use with the active layers below the substrate), the substrate 21 appears at the top of the diode 20 rather than the bottom. In this orientation, the SiC substrate becomes the primary emitting surface of the LED. It will be understood of course, that light emitting diodes can be placed in a number of different positions and orientations in end use. Thus with respect to the elements of the diode 20, the terms, "top," and "bottom," are relative and generally indicate the orientation of the device in a structural sense. The use of such terms is common and well understood in this art and will also be clear from the context herein.

The diode includes at least one, and preferably several, layers that form the light emitting ("active") portions. Two layers are shown in FIG. 1, an n-type layer 22 and a p-type layer 23. These opposite conductivity type layers provide the opportunity for current to flow through the diode and the resulting combination of electrons and holes that generate the emitted photons. Although only two Group III nitride layers are illustrated in FIG. 1, it will be understood that in other contexts, additional layers can be used including superlattice structures and multiple quantum wells. Such structures are well-understood in this art and can be practiced in the context of the present invention without undue experimentation.

The embodiment illustrated in FIG. 1 also includes a mirror layer 24 which is typically formed of silver (Ag) or a silver-platinum (Ag/Pt) alloy. The silver-based layer also provides electrical contact to the active layers 22, 23. A barrier layer 25 typically formed of a titanium tungsten (TiW) alloy, or platinum, or both, or of titanium tungsten nitride (TiWN), encloses the silver-based layer 24 in order to prevent undesired migration and reaction of silver with other portions of the device.

A solder layer 26 is attached to the barrier layer 25 typically, but not exclusively, based upon the method of making the diode. These and other structural features are set forth in the previously-incorporated '042 application. A metal or conductive semiconductor layer 27 forms a physical support and a backside ohmic contact 30 completes the structure and, with the top ohmic contact 28, provides the full current path for injecting current through the diode 20.

In an alternate embodiment, the metal or semiconductor support layer 27 can be omitted, with or without the solder layer 26. In such embodiments, the backside ohmic contact 30 is positioned against the mirror and barrier metals 24, 25.

As illustrated in FIG. 1, the active layers are typically Group III nitrides, with gallium nitride (GaN), indium gallium nitride (InGaN), aluminum gallium nitride (AlGaN), and aluminum indium gallium nitride (AlInGaN) being appropriate selections. As known to those familiar with this art, the Group III nitrides offer the opportunity to change the dominant wavelength by changing the atomic fraction of the Group III element in the ternary and quaternary combinations. As well understood in this art, these formulas can be more exactly expressed as $Al_xIn_yGa_{1-x-y}N$ in which x and y can range from 0 to 1, and inclusive of either, with the qualification that x+y must always equal 1 or less.

Figure 2:
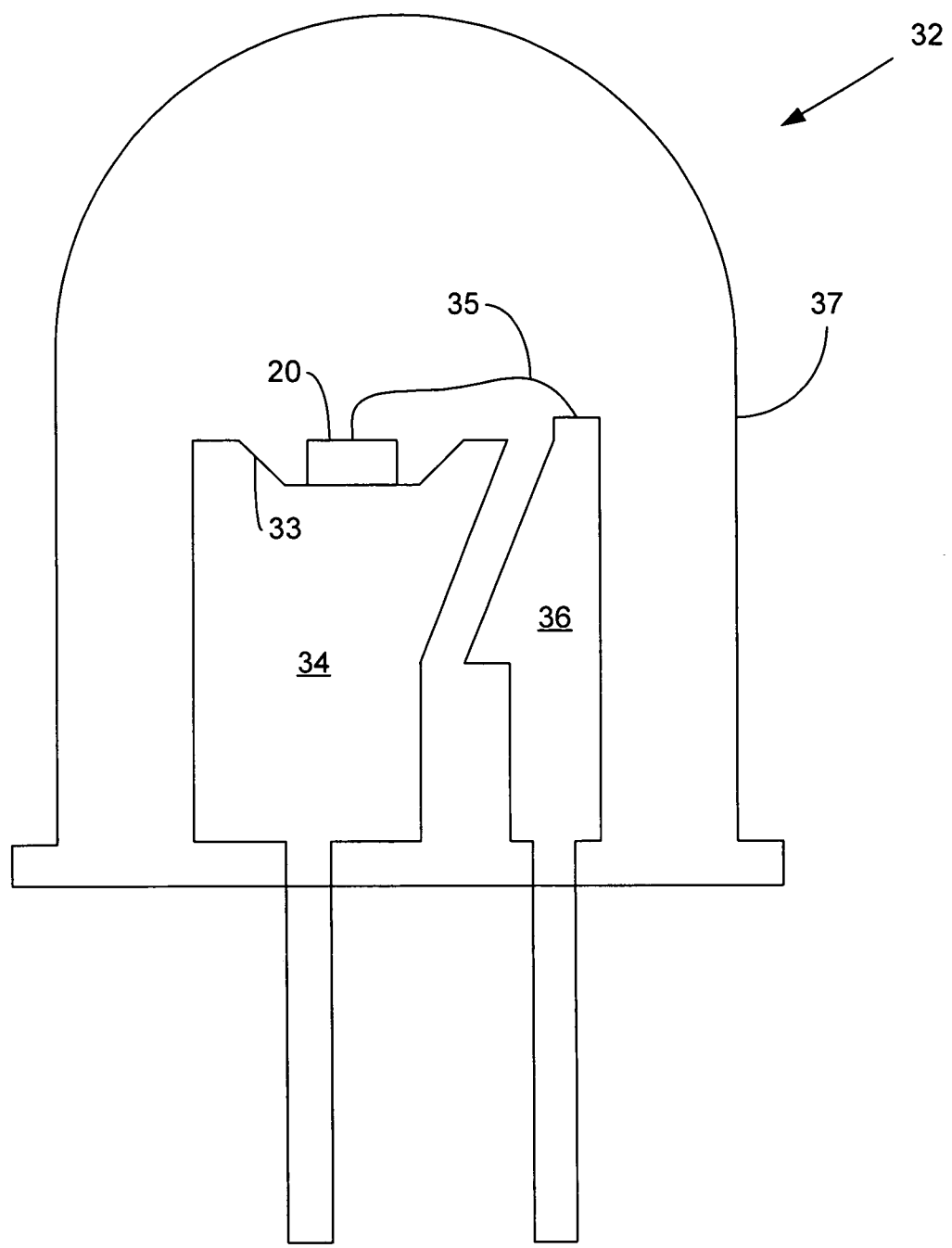
FIG. 2 is a cross-sectional view of an LED lamp according to the present invention.

FIG. 2 is a cross-sectional view of a lamp that incorporates diodes according to the present invention in standard packaging. The lamp is broadly designated at 32 and includes elements that are well understood by those of ordinary skill in this art. Indeed, as set forth in the previously-incorporated '042 application, one of the advantages of the diode disclosed therein is that its size and orientation permit it to be mounted in standard packaging with associated benefits to the manufacturer and the end-user.

The lamp 32 includes the diode which is again indicated at 20. The diode rests in a reflective cup 33 which in the type of diode illustrated in FIG. 2 is sometimes referred to as the anvil 34 and also forms one of the electrical contacts to the lamp 32. The anvil is conductive and typically formed of metal. Although for clarity's sake FIG. 2 shows the diode 20 as resting in the die cup 33, in actual practice it is typically fixed in place with a conductive glue or solder (not shown). The anvil 34 makes electrical contact with the backside ohmic contact 30 (FIG. 1) of the diode 20 and a top bond wire 35 makes electrical contact to the top ohmic contact 28 (also in FIG. 1) of the diode 20. If, of course, the backside support 27 and the ohmic contact 30 are omitted, the anvil 34 makes direct contact with the solder layer 26 or the barrier metal layer 25. In turn, the top bond wire 35 connects to another larger electrode 36 referred to as the post. The entire package includes the polymer housing or lens 37 the size and shape of which, along with the material, are chosen for specific output purposes.

Although not shown in detail in FIG. 2, for the device 20 illustrated in FIG. 1 the active layers 22, 23 are adjacent the floor of the die cup 33 with the silicon carbide substrate 21 facing upwardly away from the cup.

FIG. 2 is an exemplary and to some extent schematic diagram and very similar packages can include a surface mount, a metal can, or a metal header, as well as the epoxy lens illustrated in FIG. 2.

Although the invention is not limited to use in a 5 mm package, the 5 mm package (also known as the T-1¾ type) is commonly understood, widely available and frequently used in the industry. It thus provides an appropriate expression of the invention in terms of its packaging and use.

With these aspects as background, the performance aspects of the invention can be expressed in context. Thus, in a first embodiment, the invention is a light emitting diode with advantageous output on a per unit area basis that comprises an area of less than 100,000 $\mu^2$, forward voltage of less than 4.0 volts, a radiant flux of at least 24 milliwatts at 20 milliamp drive current, and a dominant wavelength between about 395 and 540 nm.

As well understood in the semiconductor arts, the forward voltage ($V_f$) is defined as the voltage at a given current. Generally speaking, for diodes used in small (miniaturized) applications, a low forward voltage can be advantageous, particularly at the brightness levels set forth herein. In preferred embodiments, diodes according to the invention can operate at a forward voltage of 4.0 volts or less at 20 milliamps drive current.

Radiant flux is measured by placing an encapsulated lamp of the T1¾ type in an integrating sphere attached to a spectrometer, with the Labsphere Omni LTS spectrometer for visible LEDs being an exemplary measurement device. Radiant flux is measured in units of power (Watts).

As used in the art (and herein), the term "dominant wavelength" describes a measure of the hue sensation produced in the human eye by a light emitting diode. The dominant wavelength is determined by drawing a straight line through the color coordinates of a reference illuminant and the measured chromaticity coordinates of the LED in the International Commission on Illumination (CIE) 1931 chromaticity diagram. The intersection of the straight-line on the boundary of the chromaticity diagram gives the dominant wavelength.

The peak wavelength is the wavelength at the maximum spectral power. The peak wavelength may have less significance for practical purposes because two different light emitting diodes may have the same peak wavelength, but different color perception.

An appropriate discussion of these and other optical characteristics of light emitting diodes is set forth in the Labsphere Technical Guide, "The Radiometry of Light Emitting Diodes," from Labsphere Inc. of North Sutton N.H.

The lens 37 is used to change the direction and distribution of the light rays (i.e., the spatial distribution pattern) and for some light emitting diodes is colored to serve as an optical filter. Because diodes according to the present invention are frequently used in conjunction with the production of white light, colored lenses are less commonly used.

The radiant flux of a light emitting diode is typically measured using an integrating sphere, of which the device referenced above is entirely appropriate, but not limiting.

Radiant flux, which is also referred to as the radiant power, is the rate (dθ/dt) at which the radiation field transfers radiant energy from one region to another. As noted above, if theta (θ) is the radiant energy, the unit of radiant power is the watt.

Diodes according to the present invention typically have a dominant wavelength between about 395 and 540 nm, placing them in the green, blue, violet and ultraviolet portions of the electromagnetic spectrum. In particular, diodes according to the invention have dominant wavelengths of between about 450 and 480 nm with preferred output wavelengths being between about 455 and 465 mm. This places their output squarely in the blue portion of visible spectrum which offers a number of advantages for full-color and white light for displays and related purposes.

Diodes according to the invention can have a radiant flux of at least 24 milliwatts at the 20 milliamp drive current which is a typical standard in measuring the performance of light emitting diodes of all types, and thus provides a useful comparison for diodes according to the present invention.

Blue light emitting diodes according to the present invention can be incorporated into pixels, particularly in combination with those that form other primary colors (red and green) to provide the opportunity for full-color displays.

In another aspect, a light emitting diode according to the present invention produces a radiant flux of at least 270 milliwatts per square millimeter at a dominant wavelength of between about 395 and 540 nm at a forward voltage of less than 4.0 volts and at 20 milliamps drive current.

In another aspect, the invention is a light emitting diode with an advantageous output on a per unit area basis that comprises a die with an area less than 100,000 $\mu^2$, a 5 mm package encapsulating the die, a forward voltage of less than 4.0 volts, and an external quantum efficiency of greater than 45% at wavelengths of between about 420 and 465 nm and a drive current of 20 milliamps.

As known to those familiar with light emitting diodes and their packages, of the photons generated by current injected through the diode, less than 100% escape externally from the diode. Accordingly, in this art, the term "external quantum efficiency" is used to describe the ratio of emitted light intensity to current flow (e.g., photons out/electrons in). Photons can be lost through absorption within the semiconductor material itself, through reflection losses when light passes from the semiconductor to air because of the differences in refractive index, and from the total internal refraction of light at angles greater than the critical angle defined by Snell's law. Accordingly, the external quantum efficiency (EQE) as a percentage can be calculated from the radiant flux (Watts), the wavelength (nanometers), the drive current (amps) and the conversion factor between wavelength and energy (λ=1.24/eV) according to the following formula:

$$EQE(\%) = \frac{(\text{radiant flux}) \times (\text{wavelength})}{(1240) \times (\text{drive current})} \times 100$$

Accordingly, in another aspect the invention can be described as a light emitting diode with advantageous output on a per unit basis comprising a 5 mm polymeric package; a die in the package with an area of less than 100,000 μ², a forward voltage of less than 4.0 volts, a radiant flux of at least 24 milliwatts at 20 milliamps drive current, and a dominant wavelength of between about 395 and 540 nm.

As in the other embodiments, for blue LEDs purposes, the dominant wavelength is preferably between about 450 and 480 nm and most preferably between about 455 and 465 nm. Diodes according to the invention have also demonstrated radiant flux of at least 27 milliwatts at 20 milliamps drive current.

In yet another aspect, the invention comprises a light emitting diode with a conductive silicon carbide substrate, respective p-type and n-type Group III nitride layers on a silicon carbide substrate, ohmic contacts in a vertical orientation with respect to the silicon carbide substrate and the Group III nitride layers, a dominant wavelength between 455 and 465 nm, a polymer package encapsulating the substrate, the Group III nitride layers and portions of the ohmic contacts, and a radiant flux from the package of at least about 270 milliwatts per square millimeter of the emitting surface at a drive current of 20 milliamps.

In typical embodiments, the diode is a 5 mm or surface mount package and the silicon carbide substrate has a polytype selected from the group consisting of the 3C, 4H, 6H and 15R polytypes of silicon carbide.

As used herein, and for purposes of describing and defining the luminous output, the light emitting area or surface is defined as the "footprint" of the device. For a chip or die with different portions having different dimensions, the term "area" means the largest area of semiconductor or substrate material within the die or chip, because this largest dimension is the one that the circuit or device designer must deal with in using the individual light emitting diode.

Figure 6:
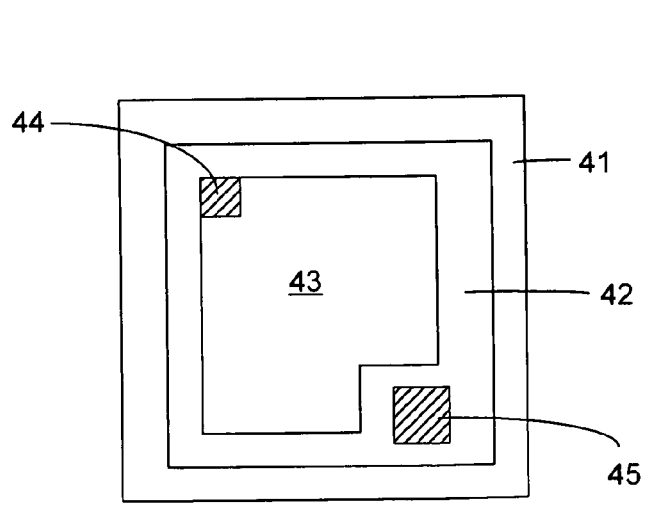
FIG. 6 is a top plan view of a prior art diode.

FIG. 6 is a top plan schematic view of a prior art diode that illustrates this point. In FIG. 6 the overall diode is broadly designated at 40 and includes a sapphire (Al₂O₃) substrate 41. Sapphire is used as the substrate in a number of types of light emitting diodes because of its generally rugged physical characteristics and satisfactory optical properties. Its crystal lattice is also a satisfactory, although not necessarily optimal, match with the crystal lattice of the Group III nitrides typically used to form blue light emitting diodes. Sapphire, however, cannot be conductively doped and thus always functions as an electrical insulator. As a result, a structure such as the one illustrated in FIG. 6 must necessarily be adopted when sapphire is selected as the substrate. The active layers, two of which are illustrated at 42 and 43, are grown on the sapphire substrate 41 to form the p-n junction for current injection purposes. Because the sapphire substrate 41 is insulating, however, the wire bond pads 44 and 45 must both face the top of the device in the manner illustrated in FIG. 6. Thus, consistent with the definitions used herein, the area of the diode 40 (for purposes of measuring and expressing output per unit area) is the area of the sapphire substrate rather than merely the area of the active layer 42 or the smaller active layer 43.

Expressed in alternative fashion, but with the same meaning, the area is the larger of either (i) the largest semiconductor area in the diode or (ii) the substrate area of the diode that must or will be packaged. In almost all circumstances, area (ii) is greater or equal to area (i).

Figure 3:
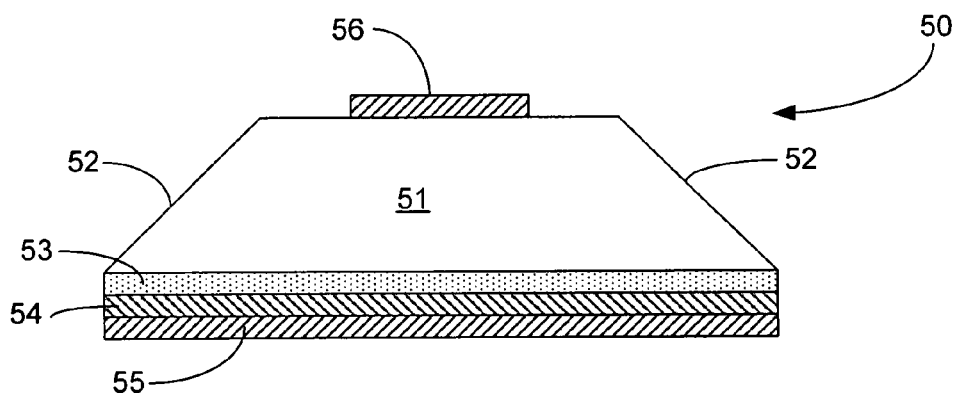
FIG. 3 is cross-sectional view of a second embodiment of a diode in accordance with the present invention.
Figure 4:
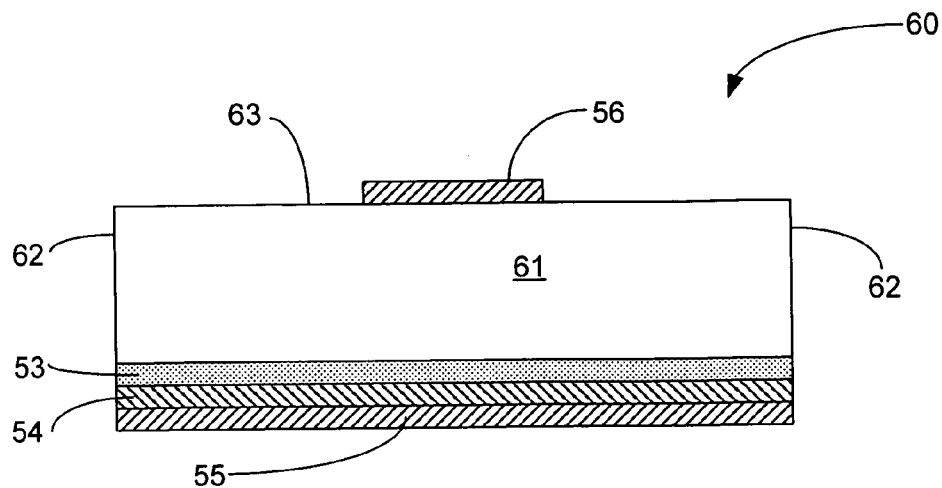
FIG. 4 is cross-sectional view of another embodiment of a diode in accordance with the present invention.
Figure 5:
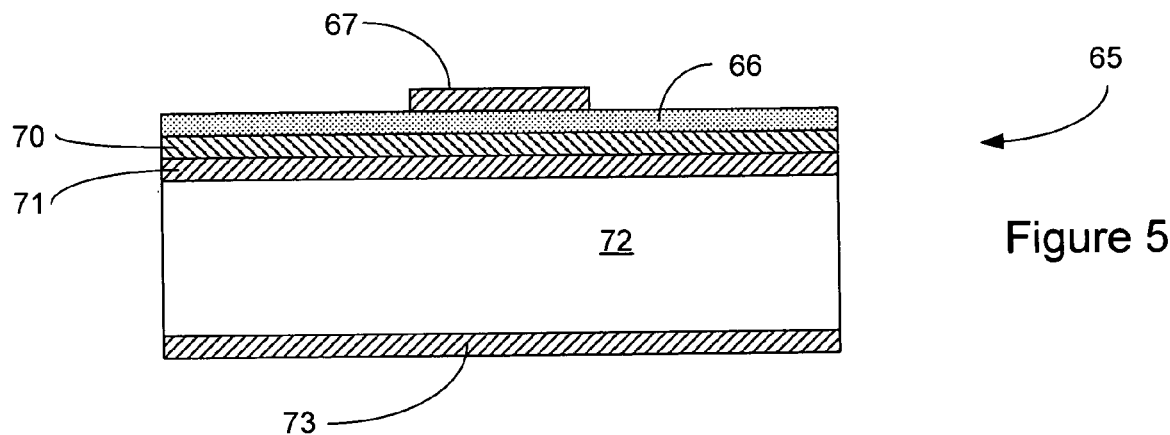
FIG. 5 is cross-sectional view of yet another embodiment of a diode in accordance with the present invention.

FIGS. 3, 4 and 5 are additional structural embodiments of diodes with performance output characteristics according to the present invention.

In FIG. 3, the diode is broadly designated at 50 and is shown in a "flip chip: orientation; i.e., the silicon carbide substrate 51 is in a top or upper arrangement when the diode 50 is mounted for use. The substrate 51 includes the oblique surfaces 52 that can increase the light output from the device by reducing total internal reflection.

The active layers are, for purposes of simplicity, illustrated as the single layer 53 but it will be understood, that the active structure usually includes at least one p-type and one n-type layer and potentially more sophisticated structures such as quantum wells, multiple quantum wells, and superlattice structures. As in a number of such diodes, the diode 50 preferably includes the mirror layer 54 which, if formed of silver, is preferably partially isolated in the manner previously discussed with respect to FIG. 1. If formed of a less reactive metal, or one less likely to migrate, the mirror layer 54 can be a simple coating as illustrated in FIG. 3. In FIG. 3, the mirror layer 54 also forms the ohmic contact.

Electrical contact to the diode 50 is made through the bonding metal contact 55 at the bottom of the device (in the illustrated orientation) and to the wire bond pad 56 at the top.

FIG. 4 illustrates a device otherwise similar to FIG. 3 and broadly designated at 60. The only relevant difference between the diode 60 of FIG. 4 and the diode 50 of FIG. 3 is in the shape of the sidewalls 62 which are perpendicular, or nearly so, to the top surface of the device 60. In FIG. 4, the slightly differently shaped substrate is designated at 61, but all of the other elements are otherwise identical in structure and function to the same elements in FIG. 3, and thus carry the same reference numerals. Accordingly, the active layer is designated at 53, the mirror-contact at 54, the top ohmic contact at 56 and the bonding metal at 55.

Although not specifically illustrated in FIG. 4 (or in the other figures), the light emitting surfaces of the diode 60, particularly the side edges 62 and top surface 63, can be formed into lenticular shapes or patterns that can help increase the light extraction from the diode. The use of lenticular surfaces for this purpose is set forth in the parent application herein, and other means of varying the surface for light extraction are likewise set forth in commonly-assigned U.S. Pat. No. 6,791,119, the contents of which are incorporated entirely herein by reference.

FIG. 5 illustrates another embodiment of the invention in which the active layer(s) 66 is positioned at the top of the device and in direct contact with an ohmic contact 67. The mirror-ohmic contact 70 is beneath the active layer 66 to increase the light extraction and a metal bonding layer 71 is optionally included to attach the active layer 66 and the mirror 70 to the substrate 72 which can be a semiconductor such as silicon carbide or potentially a conductor. An ohmic contact 73 to the substrate 72 completes the device. If the mirror-contact 70 is silver or silver-based, a barrier structure (e.g. as described with respect to FIG. 1) would also be included.

Figure 7:
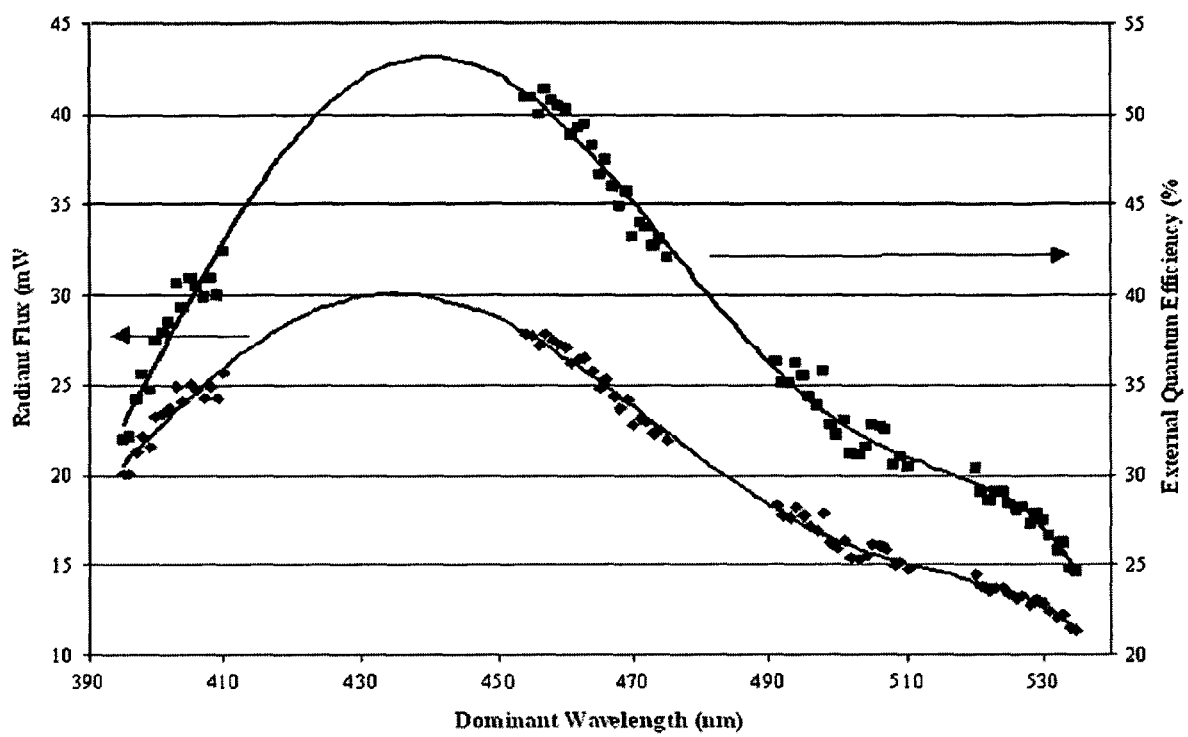
FIG. 7 is a combined plot of spectral radiant flux output and external quantum efficiency for a light emitting diode according to the present invention.

FIG. 7 is a combined plot of the spectral radiant flux output (mW, lower curve) and the external quantum efficiency (%, upper curve) for a light emitting diode according to the present invention. As illustrated therein, the relative luminous flux of the diode depends upon the wavelength. Accordingly, it will be understood that the diodes according to the present invention, although expressed in terms of performance at certain wavelengths, incorporate and include the corresponding proportional output at other wavelengths even if less than the maximum output at the most favorable wavelength for the particular diode.

Stated differently, the descriptions herein of diodes as having a certain output per unit area at a given wavelength do not limit the diodes described or claimed herein to that output at that wavelength. Instead, in a manner analogous to plotting points on an algebraic curve, the output per unit area at a given wavelength is indicative of the entire curve rather than the single point recited.

In a similar manner, the output of the diode in a 5 mm package similarly predicts with the required accuracy the output from other types of packages. Thus, once again, describing the output from a 5 mm package does not limit the invention or the claims to a 5 mm package, but instead provides the skilled person with the information necessary to identify the output covered by the claims in other types of packages.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
a die with an area of 100,000 square microns or less;
an active structure formed from Group III nitride material;
a silver-based mirror layer providing electrical contact with the active structure; and
a barrier layer including a portion that surrounds the silver-based mirror layer and extends to the active structure to prevent reaction of silver with other parts of the light emitting diode,
wherein the light emitting diode is operable with a forward voltage of less than 4.0 volts and approximately 20 milliamps of drive current to produce a radiant flux of at least 24 milliwatts and a dominant wavelength between 395 and 540 nanometers.

2. A light emitting diode according to claim 1 having a dominant wavelength between about 450 and 480 nanometers.

3. A light emitting diode according to claim 1 having a dominant wavelength between about 455 and 465 nanometers.

4. A light emitting diode according to claim 1 having a radiant flux of at least 27 milliwatts at approximately 20 milliamps drive current.

5. A light emitting diode according to claim 1 comprising ohmic contacts on respective opposite vertical sides of said diode.

6. A light emitting diode according to claim 1 comprising at least one layer of conductive silicon carbide.

7. A light emitting diode according to claim 1 comprising at least one active layer formed of a Group III nitride.

8. A light emitting diode according to claim 7 wherein said active layer is selected from the group consisting of gallium nitride, indium gallium nitride, aluminum gallium nitride, and aluminum indium gallium nitride.

9. A light emitting diode according to claim 1 that operates at a forward voltage of less than 3.5 volts.

10. A pixel that includes the light emitting diode of claim 1.

11. A display that includes the pixel of claim 10.

12. A light emitting diode according to claim 1 comprising:
a substrate with oblique surfaces that increase light output by reducing internal reflection;
a wire bond pad on the substrate; and
a 5 mm package encapsulating said die;
wherein the light emitting diode is operable with an external quantum efficiency of greater than forty five percent (45%) at wavelengths of between about 420 and 465 nm.

13. A light emitting diode according to claim 12 wherein said package includes at least a die cup and wherein said active layer is adjacent said cup and said substrate faces away from said cup.

14. A light emitting diode according to claim 13 that operates at a forward voltage of less than 3.5 volts.

15. A light emitting diode according to claim 14 that has an external quantum efficiency greater than 50% at wavelength of between about 420 and 460 nm.

16. A light emitting diode according to claim 15 that has an external quantum efficiency greater than 40% at a wavelength of between about 400 and 480 nm.

17. A light emitting diode comprising:
an active structure formed from Group III nitride material;
a silver-based mirror layer providing electrical contact with the active structure; and
a barrier layer including a portion that surrounds the silver-based mirror layer and extends to the active structure to prevent reaction of silver with other parts of the light emitting diode;
wherein the light emitting diode is operable with a forward voltage of less than 4.0 volts and a drive current of approximately 20 milliamps to produce a radiant flux per unit area of at least 270 milliwatts per square millimeter, at a dominant wavelength of between about 395 and 540 nm.

18. A light emitting diode according to claim 17 that operates at forward voltage of less than 3.5 volts.

19. A light emitting diode according to claim 17 that produces a radiant flux per unit area of at least 300 milliwatts per square millimeter.

20. A light emitting diode according to claim 17 that produces a radiant flux per unit area of at least 330 milliwatts per square millimeter.

21. A light emitting diode according to claim 17 that produces a radiant flux per unit area of at least 360 milliwatts per square millimeter.

22. A light emitting diode according to claim 17 that produces a radiant flux per unit area of at least 390 milliwatts per square millimeter.

23. A light emitting diode according to claim 17 comprising a conductive substrate and a Group III nitride active layer.

24. A light emitting diode according to claim 23 wherein said substrate comprises silicon carbide.

25. A light emitting diode according to claim 23 wherein said active layer is selected from the group consisting of gallium nitride, aluminum gallium nitride, indium gallium nitride, and aluminum indium gallium nitride.

26. A light emitting diode according to claim 17 comprising:
- a 5 mm (T1¾) polymeric package;
- a die in said package with an area of less than 100,000 square microns;
- a substrate with oblique surfaces that increase light output by reducing internal reflection; and
- a wire bond pad on the substrate.

27. A light emitting diode according to claim 26 having a dominant wavelength between about 450 and 480 nanometers.

28. A light emitting diode according to claim 26 having a dominant wavelength between about 455 and 465 nanometers.

29. A light emitting diode according to claim 26 wherein the substrate comprises silicon carbide.

30. A light emitting diode according to claim 29 having a flip chip orientation.

31. A light emitting diode comprising:
- a polymeric package;
- a die in said package with an area of less than 100,000 square microns;
- an active structure formed from Group III nitride material, the active structure further comprising a p-type layer at the bottom;
- a silver-based mirror layer providing electrical contact with the active structure; and
- a barrier layer including a portion that surrounds the silver-based mirror layer and extends to the active structure to prevent reaction of silver with other parts of the light emitting diode,
- wherein the light emitting diode is operable with a forward voltage of less than 4.0 volts and a drive current of approximately 20 milliamps to produce a radiant flux per unit area of at least 270 milliwatts per square millimeter, at a dominant wavelength of between about 395 and 540 nm.

32. The light emitting diode of claim 31 further comprising ohmic contacts in a vertical orientation.

* * * * *